(12) United States Patent
Gage et al.

(10) Patent No.: US 8,489,237 B2
(45) Date of Patent: Jul. 16, 2013

(54) HIGH THROUGHPUT METHOD OF IN TRANSIT WAFER POSITION CORRECTION IN A SYSTEM USING MULTIPLE ROBOTS

(75) Inventors: Chris Gage, Campbell, CA (US); Damon Genetti, Livermore, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/243,906

(22) Filed: Sep. 23, 2011

(65) Prior Publication Data

US 2012/0014773 A1    Jan. 19, 2012

Related U.S. Application Data

(63) Continuation of application No. 11/998,858, filed on Nov. 30, 2007, now Pat. No. 8,060,252.

(51) Int. Cl.
*G05B 19/418* (2006.01)

(52) U.S. Cl.
USPC ........... 700/248; 700/213; 700/217; 700/218; 700/299; 700/245; 700/250; 700/258; 700/259; 700/260; 700/261; 414/217; 414/416.03; 414/416.08; 414/744.2; 414/744.5; 901/2; 901/6; 901/8; 901/9; 901/14; 318/568.11; 318/568.12; 318/568.21; 118/715; 118/719; 118/729; 356/399; 356/614; 250/234; 250/559.07

(58) Field of Classification Search
USPC ................. 700/213, 217, 218, 229, 245, 248, 700/249, 250, 258, 259, 260, 261, 262, 263; 414/217, 416.03, 416.08, 422.01, 744.2, 414/744.5, 744.6, 783, 800, 804, 936, 937, 414/941; 901/2, 6, 8, 9, 14, 15, 30, 40, 46, 901/47; 318/568.11, 568.12, 568.21; 118/715, 118/719, 729; 356/237.1, 399, 614; 250/234, 250/559.07; 382/141, 151; 294/213; 702/150
See application file for complete search history.

(56) References Cited

U.S. PATENT DOCUMENTS

| | | | |
|---|---|---|---|
| 5,001,327 A | 3/1991 | Hirasawa et al. | |
| 5,483,138 A | 1/1996 | Shmookler et al. | |
| 5,563,798 A | 10/1996 | Berken et al. | |
| 5,564,889 A | 10/1996 | Araki | |
| 5,706,201 A | 1/1998 | Andrews | |
| 5,855,681 A | 1/1999 | Maydan et al. | |
| 6,198,976 B1 | 3/2001 | Sundar et al. | |
| 6,315,512 B1 | 11/2001 | Tabrizi et al. | |
| 6,315,878 B1 * | 11/2001 | Patadia et al. | 204/298.15 |
| 6,405,101 B1 | 6/2002 | Johanson et al. | |
| 6,430,468 B1 | 8/2002 | Tepman et al. | |

(Continued)

OTHER PUBLICATIONS

U.S. Appl. No. 11/998,857, Office Action mailed Jun. 24, 2011.

(Continued)

*Primary Examiner* — McDieunel Marc
(74) *Attorney, Agent, or Firm* — Weaver Austin Villeneuve & Sampson LLP

(57) ABSTRACT

Methods correcting wafer position error are provided. The methods involve measuring wafer position error on a robot during transfer to an intermediate station. This measurement data is then used by a second robot to perform wafer pick moves from the intermediate station with corrections to center the wafer. Wafer position correction may be performed at only one location during the transfer process. Also provided are systems and apparatuses for transferring wafers using an intermediate station.

16 Claims, 16 Drawing Sheets

U.S. PATENT DOCUMENTS

| | | |
|---|---|---|
| 6,508,883 B1 | 1/2003 | Tanguay |
| 6,568,552 B1 | 5/2003 | Tabrizi et al. |
| 6,610,150 B1 | 8/2003 | Savage et al. |
| 6,760,976 B1 | 7/2004 | Martinson et al. |
| 7,357,842 B2 | 4/2008 | Ishikawa et al. |
| 7,658,586 B2 | 2/2010 | Niewmierzycki et al. |
| 7,694,647 B2 | 4/2010 | Ishikawa et al. |
| 7,743,728 B2 | 6/2010 | Ishikawa et al. |
| 7,925,377 B2 | 4/2011 | Ishikawa et al. |
| 8,060,252 B2 * | 11/2011 | Gage et al. .................... 700/248 |
| 8,293,071 B2 * | 10/2012 | Lee .......................... 156/345.55 |
| 2001/0020199 A1 | 9/2001 | Bacchi et al. |
| 2002/0053509 A1 | 5/2002 | Hanson et al. |
| 2002/0098072 A1 | 7/2002 | Sundar |
| 2003/0202865 A1 | 10/2003 | Ponnekanti et al. |
| 2004/0151574 A1 | 8/2004 | Lu |
| 2005/0137751 A1 | 6/2005 | Cox et al. |
| 2005/0265814 A1 | 12/2005 | Coady |
| 2006/0039781 A1 | 2/2006 | Niewmierzycki et al. |
| 2006/0045664 A1 | 3/2006 | Niewmierzycki et al. |
| 2008/0152463 A1 * | 6/2008 | Chidambaram et al. ...... 414/217 |
| 2009/0142163 A1 | 6/2009 | Genetti et al. |
| 2009/0143911 A1 | 6/2009 | Gage et al. |
| 2010/0278623 A1 | 11/2010 | Blank et al. |

OTHER PUBLICATIONS

U.S. Appl. No. 11/998,858, Office Action mailed Apr. 15, 2011.
U.S. Appl. No. 11/998,858, Notice of Allowance mailed Sep. 19, 2011.
U.S. Appl. No. 11/998,858, Allowed Claims as of Sep. 19, 2011.
US Final Office Action, dated Dec. 23, 2011, issued in U.S. Appl. No. 11/998,857.

* cited by examiner

HIGH THROUGHPUT METHOD OF IN TRANSIT WAFER POSITION CORRECTION IN A SYSTEM USING MULTIPLE ROBOTS

This application is a continuation of and claims priority to U.S. patent application Ser. No. 11/998,858, filed Nov. 30, 2007, titled "HIGH THROUGHPUT METHOD OF IN TRANSIT WAFER POSITION CORRECTION IN A SYSTEM USING MULTIPLE ROBOTS," which is incorporated herein by reference in its entirety.

BACKGROUND

Different types of tools are used to perform hundreds of processing operations during semiconductor device fabrication. Most of these operations are performed in vacuum chambers at very low pressure. Wafers are introduced to the process chambers with wafer handling systems that are mechanically coupled to the process chambers. The wafer handling systems transfer wafers from the factory floor to the process chamber. These systems include loadlocks to bring the wafers from atmospheric conditions to very low pressure conditions and back, and robots to transfer the wafers to various positions. In performing the various wafer handling tasks, the wafer transfer robots use programmed coordinate information of the loadlocks, process modules, etc. At certain points, the position of a wafer may need to be adjusted to correct for wafer shifting during robot hand-off, robot movement or in a loadlock, process module or cassette.

Throughput—the number of wafers that is processed in a period of time—is affected by the process time, the number of wafers that are processed at a time, as well as timing of the steps to transfer the wafers. What are needed are improved methods and apparatuses for increasing throughput.

SUMMARY

Methods, systems and apparatuses for correcting wafer position error are provided. The methods involve measuring wafer position error on a robot, e.g. a dual side-by-side end effector robot, during transfer to an intermediate station. This measurement data is then used by a second robot to perform wafer pick moves from the intermediate station with corrections to center the wafer. Wafer position correction may be performed at only one location during the transfer process.

One aspect of the invention relates to a method of transferring wafers from a first location to a second location. The method involves measuring wafer position information of one or more wafers handled by a first robot during transfer from the first location to an intermediate location and picking the one or more wafers from the intermediate location with a second robot for transfer to the second location, wherein picking the one or more wafers comprises using the measured position information to determine the trajectory of one or more end effectors of the second robot during the pick move.

Another aspect of the invention relates to a method of transferring wafers from a first location to a second location. The method involves extending a dual end effector arm of a first robot to a first location having first and second side-by-side wafers to pick the wafers such that each wafer is supported by an end effector; retracting the dual end effector arm along a nominal path and moving the dual end effector arm along a nominal path to an intermediate station; extending the dual end effector arm along a nominal path to simultaneously place the wafers at the intermediate location; wherein position information of the wafers relative to the end effectors is measured at some point during the nominal retraction, transfer or extension moves; sending the position information to a second robot and receiving the position information with the second robot; picking the first wafer from the intermediate location with a first end effector of the second robot to from the intermediate location, wherein the position of the end effector during the pick move is adjusted based on the received position information; picking the second wafer from the intermediate location with a first end effector of the second robot to from the intermediate location, wherein the position of the end effector during the pick move is adjusted based on the received position information; transferring the wafers to the second location along a nominal path; and simultaneously placing the wafers at the second location.

Another aspect of the invention relates method of transferring wafers from a first location to a second location, including the operations of extending an arm of a first robot to a first location having one or more wafers to pick the one or more wafers such that each wafer is supported by an end effector; retracting the arm along a nominal path and moving the arm along a nominal path to an intermediate station; extending the arm along a nominal path to place the one or more wafers at the intermediate location; wherein position information of the one or more wafers relative to its respective end effector is measured at some point during the nominal retraction, transfer or extension moves;

storing and/or sending the position information to a second robot; picking the one or more wafers from the intermediate location with a second robot wherein picking the one or more wafers comprises adjusting an end effector based on the position information of the wafer being picked such that each wafer is centered on the end effector; transferring the one or more wafers to the second location along a nominal path; and placing the one or more wafers at the second location.

Other aspects of the invention relate to systems and apparatuses for performing the methods describe herein.

The details of one or more embodiments are set forth in the accompanying drawings and the description below. Other features, objects and advantages will be apparent from the description and drawings, and from the claims.

DETAILED DESCRIPTION

Overview

Wafer handling systems transfer wafers from the factory floor to process chambers. These systems include loadlocks to bring the wafers from atmospheric conditions to very low pressure conditions and back, and robots to transfer the wafers to various locations. In transferring wafers from one location to another, wafer transfer robots use programmed coordinate information of the loadlocks, process modules, wafer cassettes, or other components to move along a standard path, e.g., from a loadlock to a process module. At certain points, the position of a wafer may need to be adjusted to correct for wafer shifting during robot hand-off, or robot movement with relation to the loadlock, process module or cassette.

Provided herein are methods and apparatuses for wafer position correction that may be used to increase wafer throughput. In certain embodiments, the methods and apparatuses are used in dual wafer transfer, in which two wafers are moved in parallel from one location to another. For the purposes of discussion, dual wafer transfer is described below, however certain embodiments of the wafer position correction methods and apparatus may be used in single wafer transfer and/or transfer of multiple wafers. Given the details and description below, one skilled in the art will understand how to implement single and multiple wafer embodiments.

Figure 1:
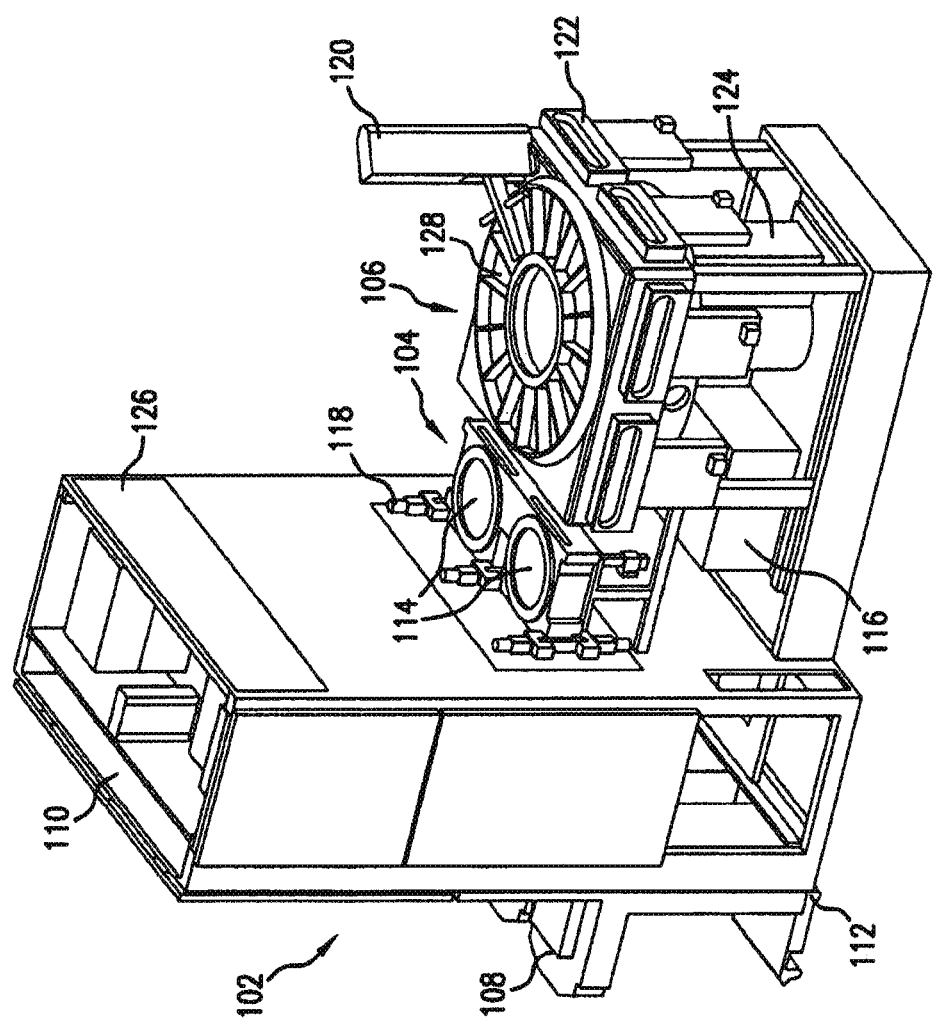
FIG. 1 is a schematic of an exterior of a dual wafer handling apparatus and components thereof according to various embodiments.

FIG. 1 shows an exterior of dual wafer handling apparatus and components thereof according to aspects of the invention. The apparatus shown in FIG. 1 may be used to transfer wafers from atmospheric conditions (e.g., to and from a storage unit) to one or more processing chambers (e.g., PECVD chambers) and back again. The apparatus shown in FIG. 1 has three main components: an atmospheric environment 102, loadlocks 104 and a transfer module 106. Storage units (e.g., Front Opening Unified Pods or FOUPs) and processing chambers are not shown in the figure. Atmospheric environment 102 is typically at atmospheric pressure and can interact with FOUPs and/or parts of the external facility. Transfer module 106 is typically at sub-atmospheric pressure and can be in communication with the loadlocks and various processing chambers which are often run at vacuum or low pressure. Wafers are placed in loadlocks 104 for pump-down or vent operations when transitioning between atmospheric and sub-atmospheric environments.

The atmospheric environment 102 (also referred to as a 'mini-environment') contains an atmospheric robot (not shown) that transfers wafers to and from FOUPs and loadlocks The robot can also be used to transfer wafers to Integrated Metrology Modules, or aligners, or other optional accessories in the mini-environment. Pod loaders 108 receive and support FOUPs so that they may be accessed by the atmospheric robot. The atmospheric environment 102 typically contains an overhead fan filter unit, e.g., a HEPA filter unit, to prevent contaminants from entering the atmospheric environment. The air inlet 110 for the fan filter unit is shown in FIG. 1. The lower boundary of the atmospheric or mini-environment may be a false floor, such as that depicted in FIG. 1 at 112.

Loadlocks 104 receive inbound (unprocessed) wafers from the atmospheric environment 102 to be transferred to the process chambers, and outbound (processed) wafers from the transfer module 106 to be transferred back to the FOUPs. A loadlock may be bidirectional (holding inbound and outbound wafers) or unidirectional (holding only inbound or outbound wafers). In certain embodiments, the loadlocks are unidirectional. Inbound wafers are also referred to herein as incoming or unprocessed wafers; outbound wafers are also referred to herein as outgoing or processed wafers.

In FIG. 1, there are two independent loadlocks: an upper loadlock stacked on top of a lower loadlock, each having two connected chambers. In certain embodiments, the upper loadlock is an inbound loadlock and the lower loadlock is an outbound loadlock. In other embodiments, both upper and lower loadlocks can be configured as inbound and outbound. Plates 114 are lids of the inbound loadlock, each plate covering one of the two connected chambers. Loadlock vacuum pumps 116 are used to pump down the loadlocks as necessary during operation.

Atmospheric valve doors 118 provide access to the loadlocks from the atmospheric environment 102. In the embodiment shown, a four door slit valve externally mounted to the mini-environment is used, though any type of doors or valves including gate valves, sliding doors, rotational doors, etc., may be used.

The transfer module is configured to be attached to one or more process modules (e.g., single or multi-station PECVD chambers, UV cure chambers, etc.). A process module may be attached to the transfer module 106 at multiple interface locations/sides of the transfer module. Slit valves 122 provide access from the transfer module to the process modules. Any appropriate valve or door system may be used. In FIG. 1, there are two valves per side—allowing two wafers to be transferred between a loadlock and a process module (e.g., between two chambers of a loadlock and two adjacent stations of a process module) or between two process modules. Transfer module lift assembly 120 is used to raise and lower the cover 128 of the transfer module. In FIG. 1, cover 128 is down (i.e., the interior of the transfer module is not shown in the figure). A vacuum transfer robot is located in the interior of the transfer module to transfer wafers between the loadlocks and the process modules or from process module to process module.

The transfer module 106 is maintained at sub-atmospheric pressure, and is sometimes referred to herein as a vacuum transfer module. Transfer module pressure is typically between 760 torr—1 miliTorr, though in certain embodiments the tool may be used for even lower pressure regimes. Once an inbound wafer is in place in the loadlock, the loadlock vacuum pumps 116 are used to pump down the loadlock to a sub-atmospheric pressure so that the wafer may be subsequently transferred to the vacuum transfer module. Loadlock slit valves 122 provide access to the loadlocks from the transfer module 106. Transfer module vacuum pump 124, along with a gas mass flow controller (MFC), a throttle valve and a manometer, are used to obtain and maintain the desired pressure of the transfer module. In general, on-tool or off-tool vacuum pumps may be used for the transfer module. As is known in the art, various methods of controlling pressure in the transfer module exist. In one example, an MFC provides a constant flow of $N_2$ gas into the transfer chamber. The manometer provides feedback as to the pressure of the transfer module chamber. The vacuum pump removes a constant volume of gas per unit time as measured in cubic feet per minute. The throttle valve actively maintains a pressure set point through the use of a closed loop control system. The throttle valve reads the manometer's pressure feedback, and based on the commands from the valve's control system, adjusts the opening of the effective orifice to the vacuum pump.

An access panel 126 provides access to an electronics bay that contains a control system to control the wafer handling operations, including robot movements, pressure, timing, etc. The control system may also control some or all operations of processes performed in the process module. The controllers, switches, and other related electrical hardware can be located elsewhere according to various embodiments.

Figure 2A:
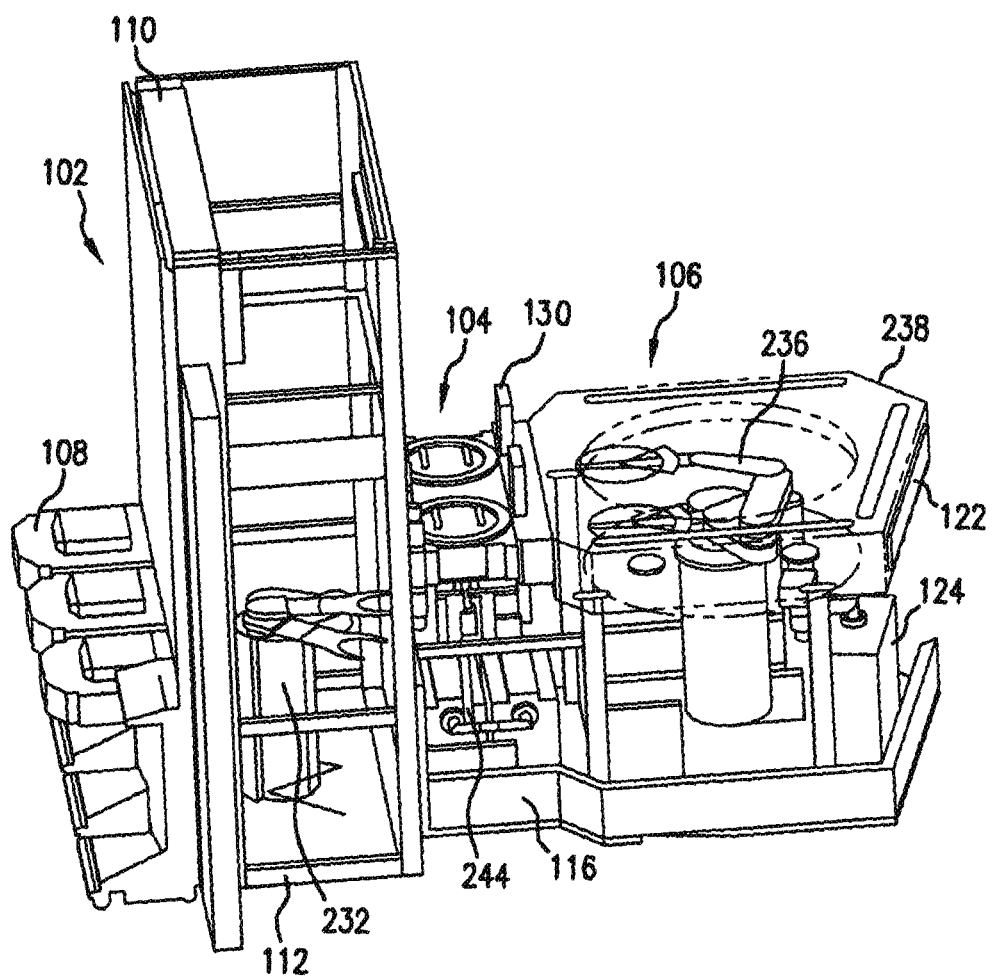
FIGS. 2a and 2b are schematics of a dual wafer handling apparatus that show an internal views of the atmospheric environment and the transfer module according to various embodiments.
Figure 2B:
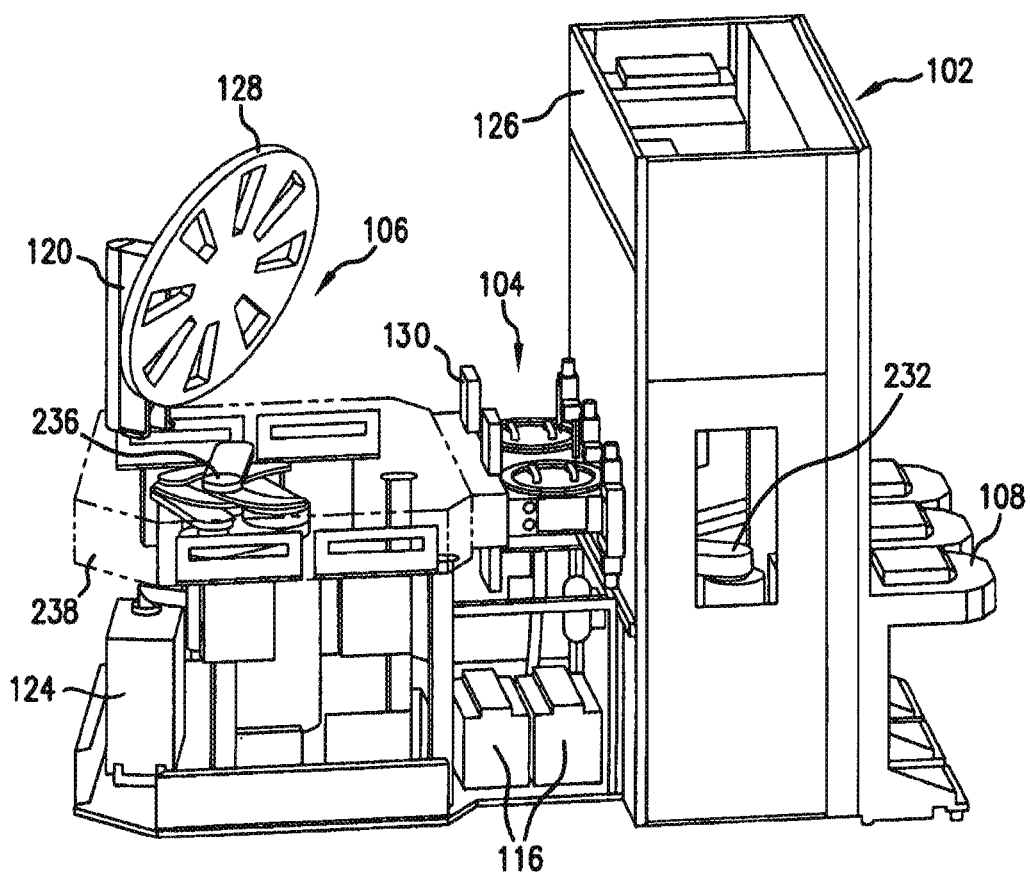

FIGS. 2a and 2b are additional schematics of a dual wafer handling apparatus that show internal views of the atmospheric environment 102 and transfer module 106. The apparatus shown in FIGS. 2a and 2b is essentially the same as that shown in FIG. 1, with the shape of the transfer module of the apparatus in FIGS. 2a and 2b a trapezoid to allow a larger access 238 area to service the transfer module. The transfer module lift assembly and lid, and a portion of the atmospheric environment casing are not shown in FIG. 2a.

The atmospheric environment 102, sometimes referred to as the "Mini-Environment," contains an atmospheric robot 232. The transfer module 106 contains a vacuum robot 236. In the embodiment depicted in FIG. 2a, the atmospheric robot 232 has one arm, with two articulated wrists, each of which has a paddle or other end effector capable of carrying a wafer. Vacuum transfer robot 236 has two arms, each with two paddles capable of carrying a wafer. The atmospheric robot is capable of handling two wafers simultaneously and the vacuum robot can simultaneously carry up to four wafers. (The apparatus and methods described herein are not limited to these particular robot designs, though generally each of the robots is capable of handling, transferring, or exchanging at least two wafers.)

FIG. 2a also provides a partial view of a pipe 244, also referred to the loadlock pump foreline, that leads from a manifold to the vacuum pumps 244. Dual vacuum pumps 244 work in tandem and are used to pumpdown both loadlocks According to various embodiments, the the dual pumps may function as a single pump resource or could be dedicated to a specific loadlock for parallel pump downs. FIG. 2b shows a schematic of the apparatus shown in FIG. 2a from the opposite side. The transfer module lift assembly 120 and the transfer module lid 128 are shown in an upright position.

Figure 3A:
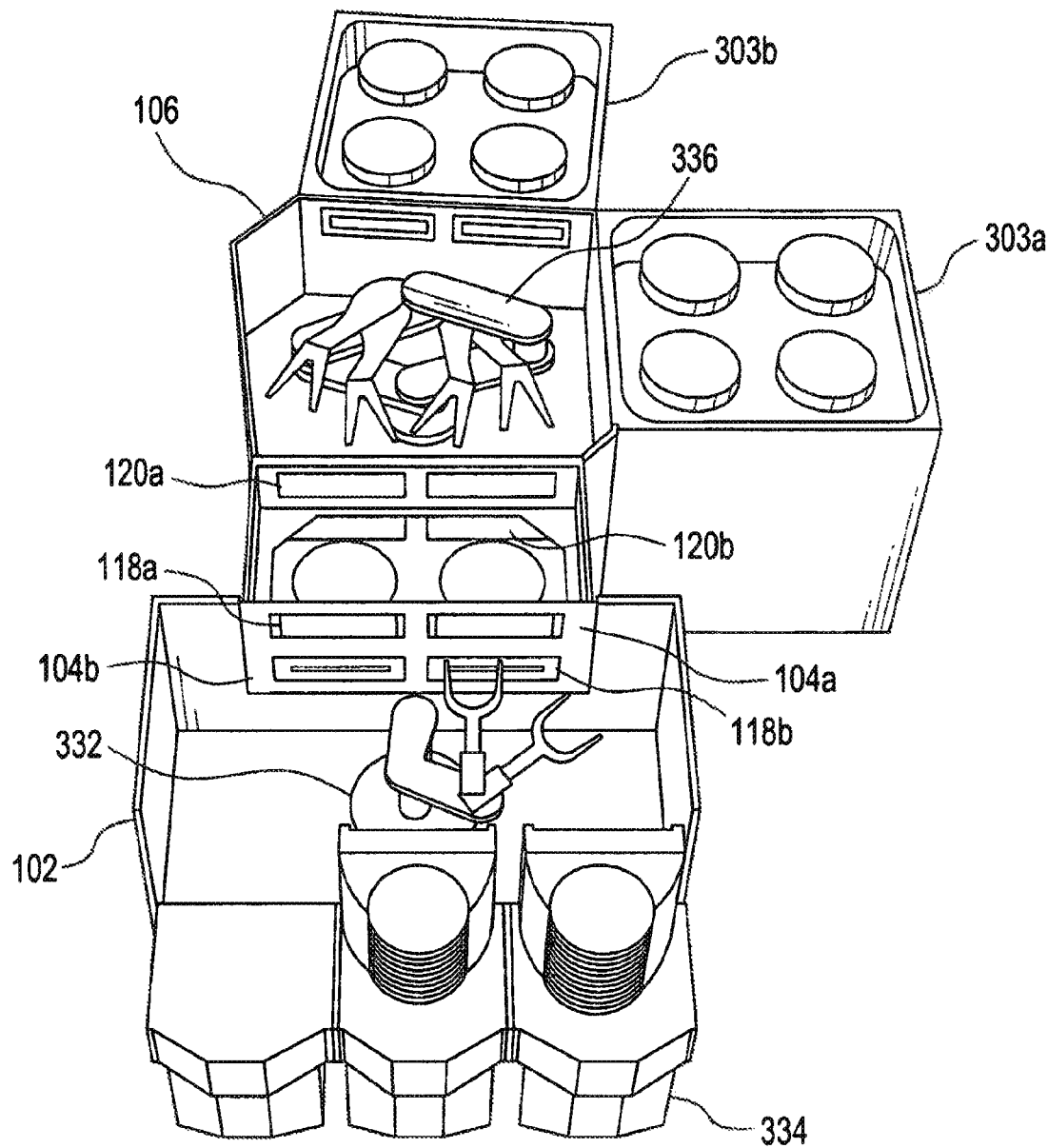
FIGS. 3a-e are graphical representations showing top views of a dual wafer transport apparatus performing certain operations in dual wafer transport of a pair of wafers from a storage cassette to a wafer transfer module and back according to certain embodiments.

FIGS. 3a-f are graphical representations showing certain operations in dual wafer transport of a pair of wafers from FOUPs to the wafer transfer module and back. FIG. 3a shows an apparatus with transfer module 106, upper (inbound) loadlock 104a, lower (outbound) loadlock 104b and atmospheric environment 102. Also shown are process modules 303a and 303b. At this point, prior to their entry into atmospheric environment 102, wafers are located in e.g., FOUPs 334, which interface with the atmospheric environment 102. The atmospheric environment 102 contains an atmospheric robot 332; the transfer module 106 contains a vacuum robot 336.

As indicated above, the apparatus is capable of parallel transport and processing of two wafers. Both the atmospheric and transfer module vacuum robots are capable of simultaneous handling at least two wafers.

Atmospheric robot 332 has one arm, with two articulated wrists, each of which has gripper capable of carrying a wafer. Vacuum transfer robot 336 has two arms, each with two blades or grippers capable of carrying a wafer.

Figure 3B:
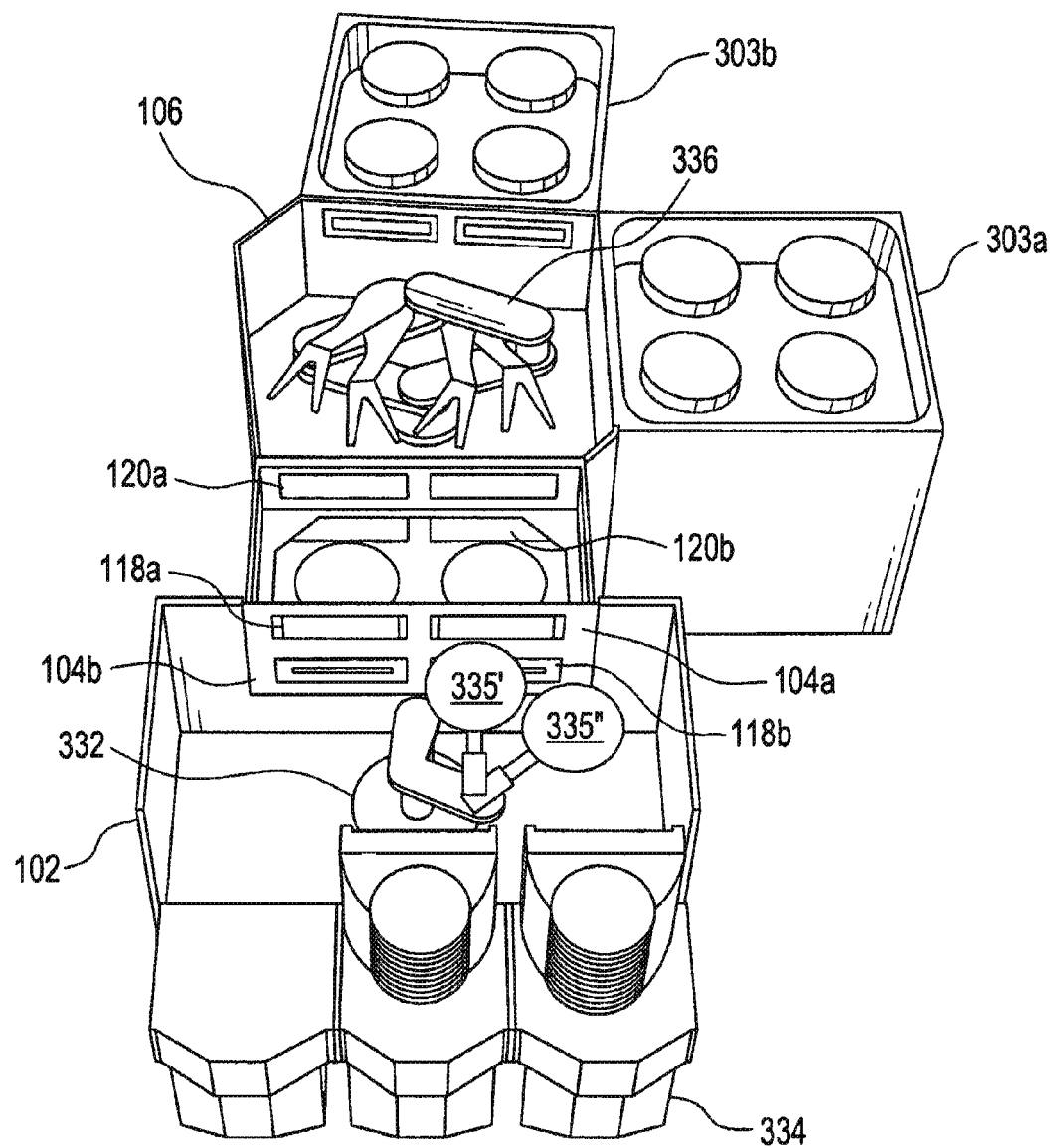
Figure 3C:
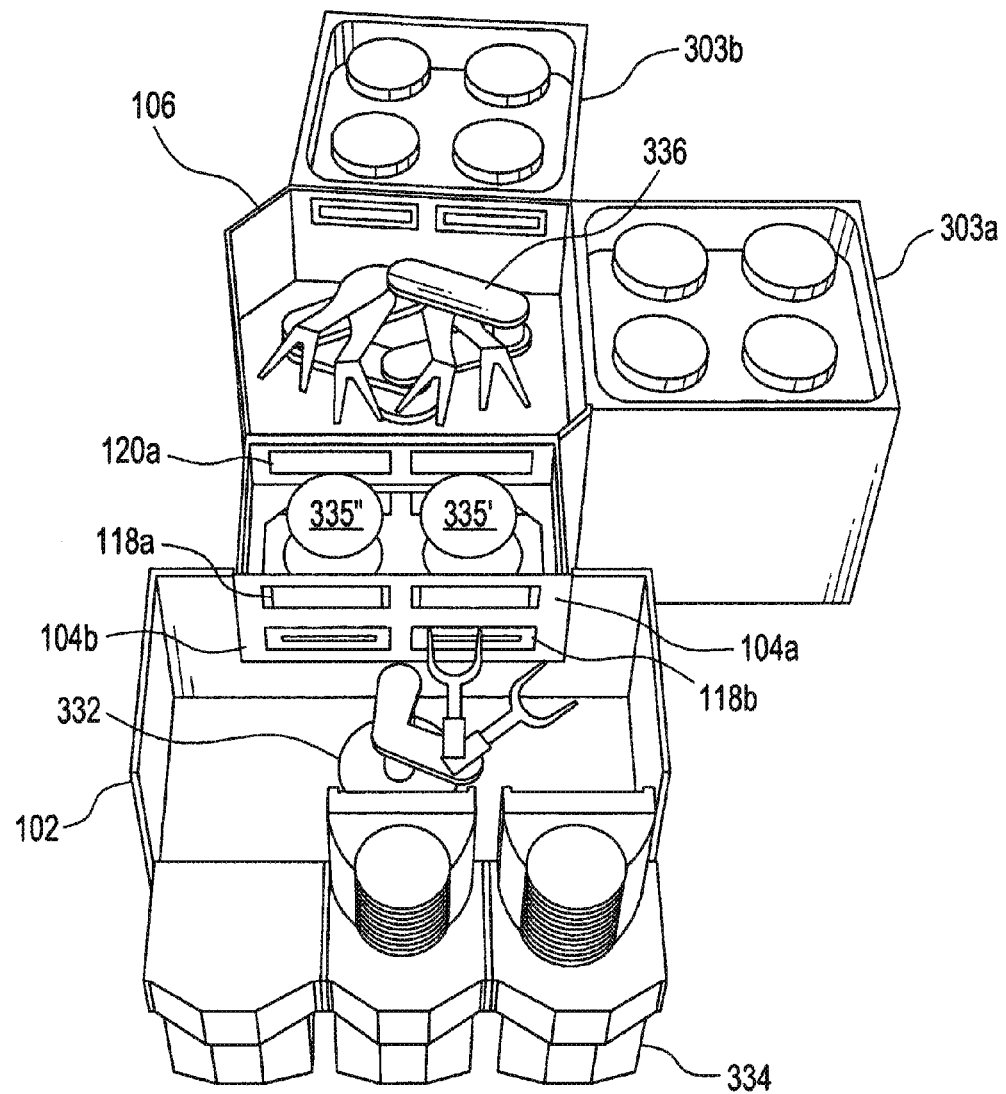
Figure 3D:
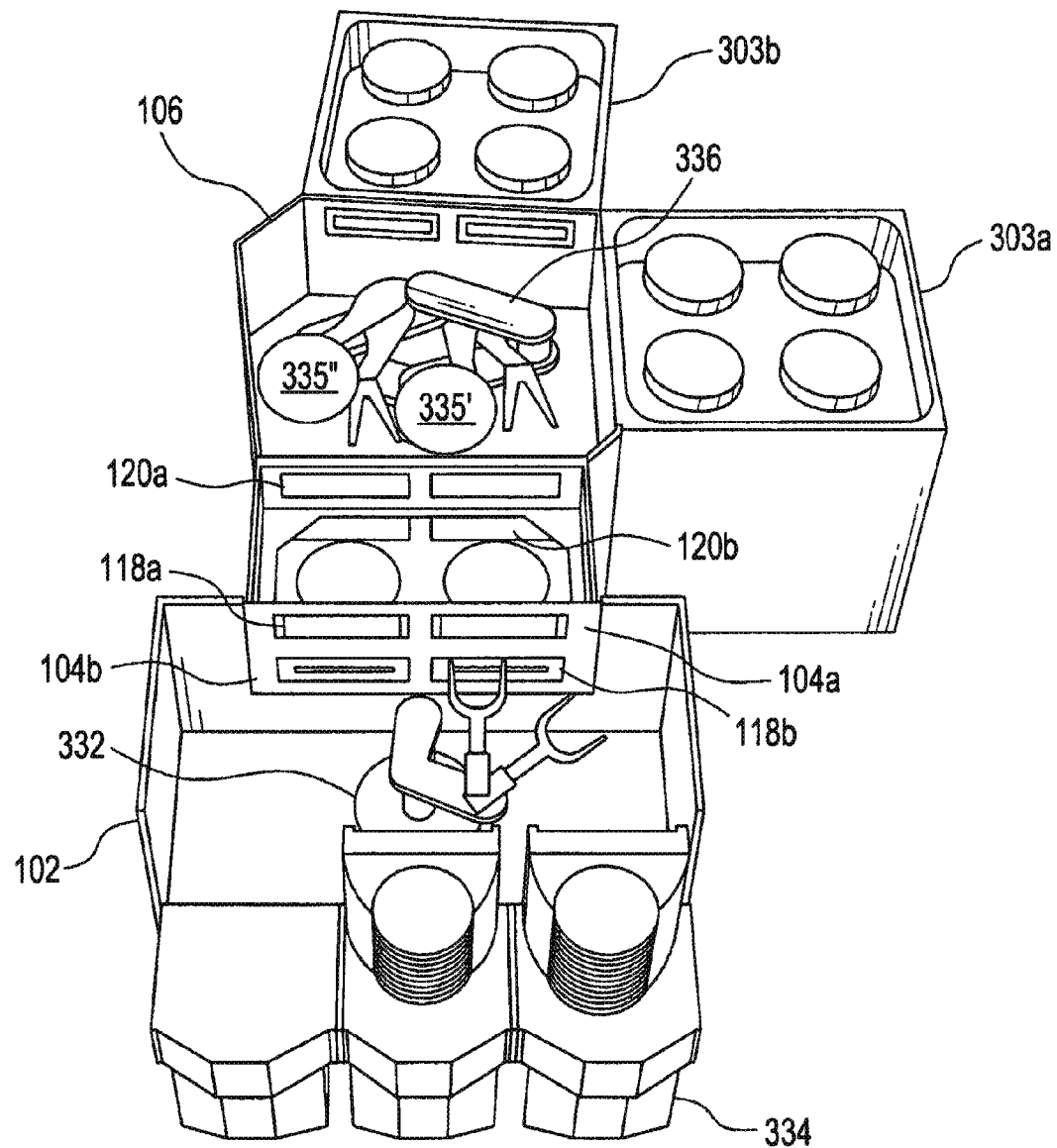
Figure 3E:
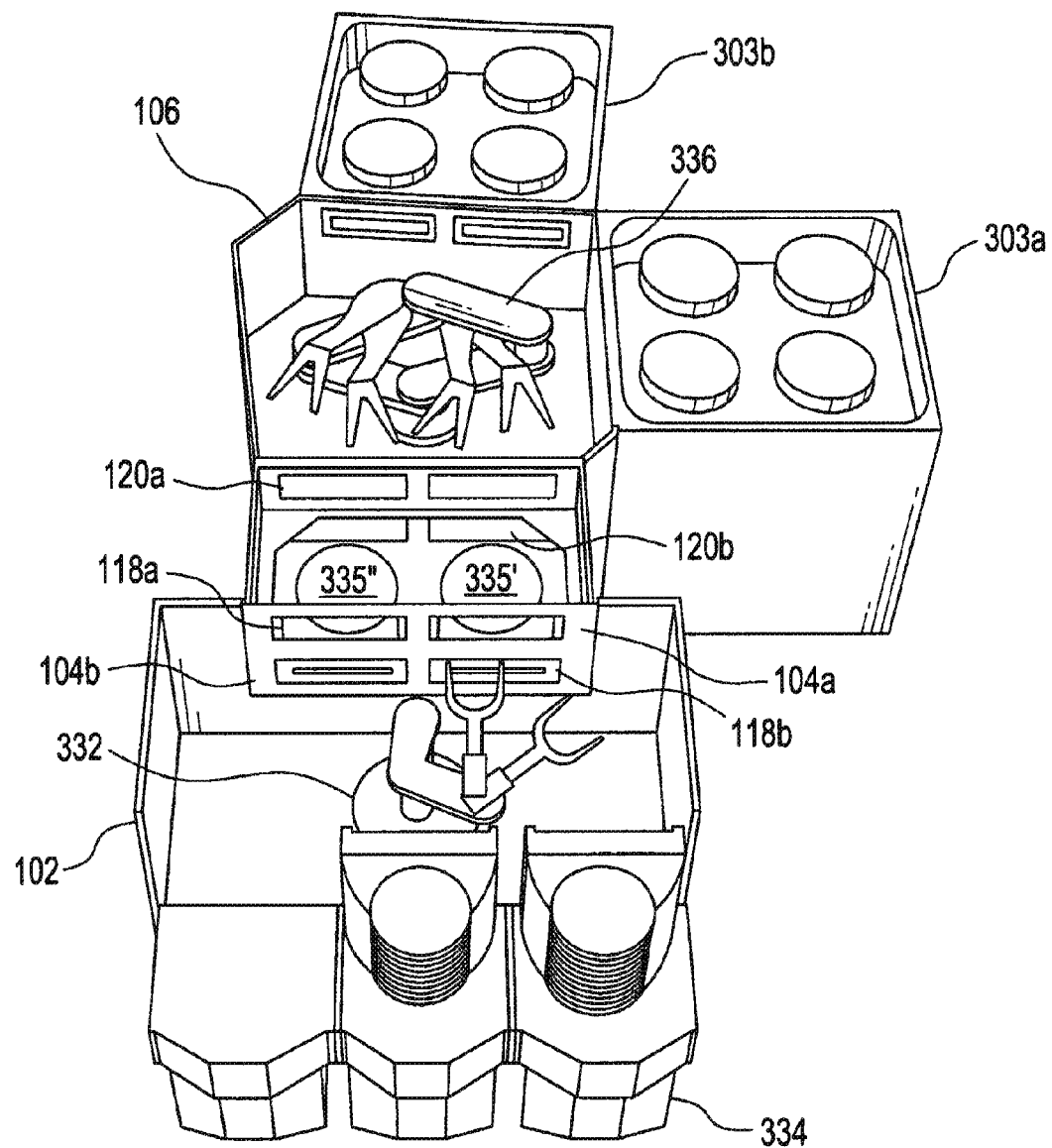
Figure 3F:
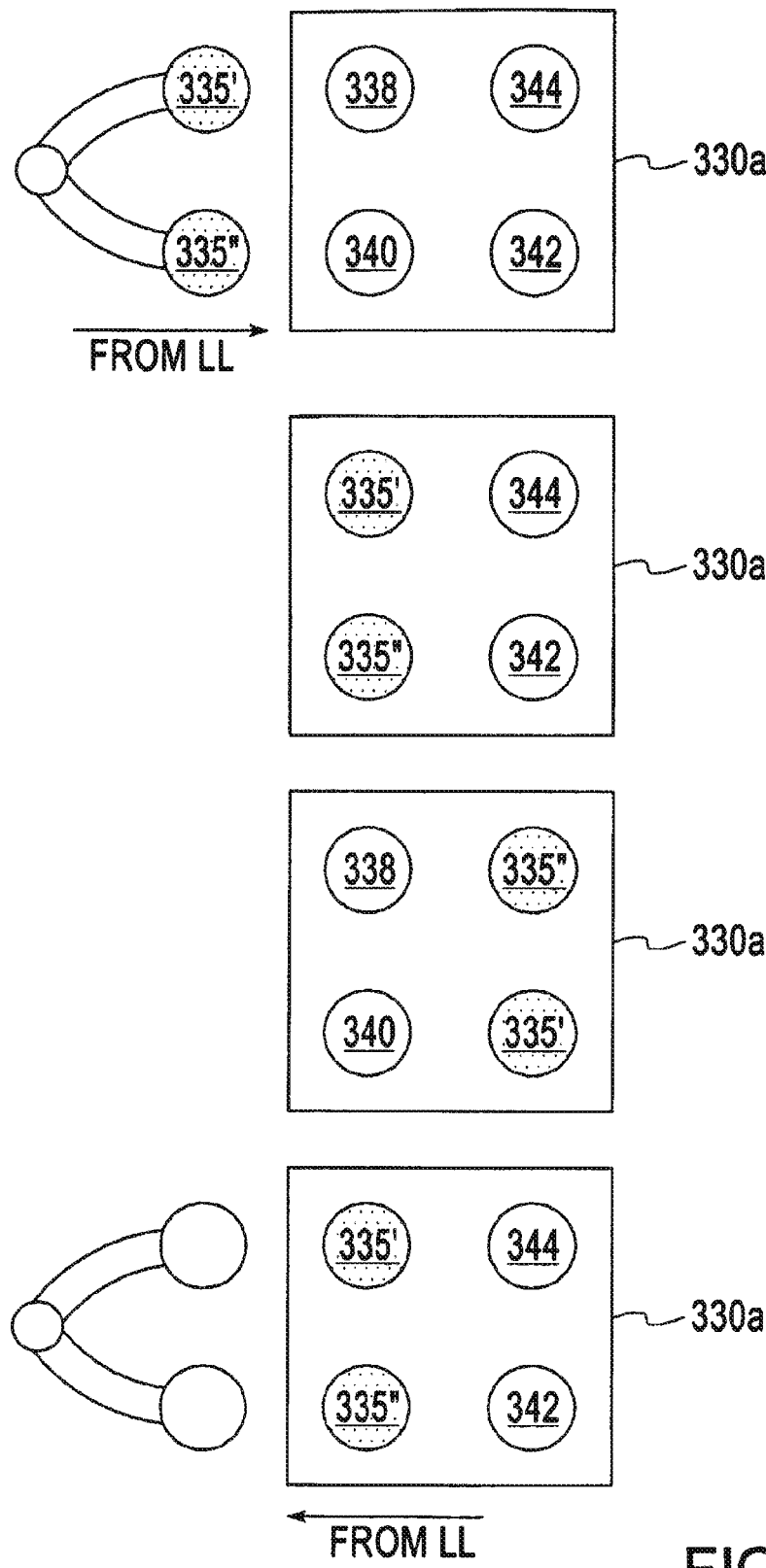
FIG. 3f shows an example of a sequence of movements a pair of wafers may undergo in a process module according to certain embodiments of the methods and apparatuses described herein.

The atmospheric robot takes two wafers from FOUPs. (The movement of a wafer from a location such as a FOUP, loadlock or processing station to a robot is sometimes referred to herein as a "pick" move, while the placement of a wafer to a location by the robot is sometimes referred to herein as a "place" move. These moves are also referred to herein as "get" and "put" moves, respectively.) Depending on the robot and the arrangement of the FOUPs or other wafer storage, the two wafers may be taken simultaneously or one after another. In the embodiment depicted in FIG. 3a, for example, the atmospheric robot has one arm with two articulated wrists and is capable of simultaneous transfer of two stacked wafers, e.g., simultaneous picks of two stacked wafers from a FOUP. FIG. 3b shows the atmospheric robot 332 with two wafers 335' and 335" during transfer from the FOUP the upper loadlock 104a. The atmospheric robot then places the wafers into the upper loadlock 104a for depressurization. This is shown in FIG. 3c. One wafer is in each chamber. Once the wafers are placed in the upper loadlock, the atmospheric doors 118a of the upper loadlock close and the loadlock is pumped down. When the desired pressure is reached, the upper loadlock doors 120a on the transfer module side are open and transfer module robot 106 picks the wafers from the upper loadlock. FIG. 3d shows transfer module robot 106 with wafers 335' and 335". The transfer module robot depicted in FIGS. 3a-e has two arms, each with two end effectors and is capable of holding four wafers simultaneously. In the embodiment shown, the upper loadlock does not have passive wafer centering, nor are there independent z-drives in the loadlock for each of the wafers. Accordingly, in the embodiment shown, the vacuum robot picks the wafer simultaneously and cannot selectively pick one wafer if two wafers are present in the incoming loadlock. However, depending on the robot and the system, the transfer module robot may pick each wafer simultaneously or consecutively. Also depending on the robot and the system, the robot may use one arm with two end effectors to pick both wafers, or each wafer may be picked by a different arm. After picking the unprocessed wafers from the inbound loadlock, the transfer module robot transfers the wafers to a processing module, i.e., either process module 303a or process module 303b, by rotating and placing the wafers in the process module. Although not depicted in FIGS. 3a-e, there may also be a third processing module connected to the transfer module. The wafers then undergo processing in the processing module. FIG. 3f shows an example of a sequence of movements the wafers may undergo in a process module 330a. First, wafer 335' is placed in station 338 of processing module 330a and wafer 335" is placed in station 340 of processing module 330a. The wafers then undergo processing at these stations. Wafer 335" moves from station 340 to station 344 and wafer 335' from station 338 to station 342' for further processing. The wafers are then returned to their original stations to be picked by the transfer module robot for transfer to the outbound loadlock or to another processing module for further processing. For clarity, the stations are depicted as 'empty' in the figure when not occupied by wafers 335' and 335", in operation all stations are typically filled by wafers. The sequence illustrated in FIG. 4 is just an example of a possible sequence that may be employed with the apparatuses described herein. The transfer module robot picks both wafers up for simultaneous transfer to the loadlock. The pick moves may occur simultaneously or consecutively. The robot then rotates to place the processed wafers in the loadlock. Again, these moves may occur simultaneously or consecutively according to various embodiments. FIG. 3e shows the now processed wafers 335' and 335" placed in the outbound (lower) loadlock 104b. After being placed there, all loadlock valves or doors are shut and the outbound loadlock is vented (pressurized) to atmospheric pressure. The wafers may also be cooled here. The atmospheric doors of the outbound loadlock are then opened, and the atmospheric robot picks up the processed wafers and transfers them to the appropriate place in the FOUP.

Wafer position correction may occur at various points in the process described above. According to embodiments described further below, inbound wafer position is corrected at placement into the process module by the transfer module robot. According to various embodiments described further below, outbound wafer position is corrected during the pick move from the loadlock by the ATM robot. Wafer position may also be corrected at other points during transfer instead of or in addition to these points.

In certain embodiments, the loadlocks are used in unidirectional operation mode. An example of inbound and outbound loadlocks, atmospheric robot and transfer module robot moves in a unidirectional flow scheme is given below in Table 1:

3—Upper LL Pumpdown (see FIG. 3c)
4—TM Robot Pick
5—TM Robot Process Module Place The path of a pair of processed wafers going from a process module to a FOUP is traced in the Table in steps 1'-5':
1'—TM Robot Process Module Pick
2'—TM Robot Lower LL Place
3'—Lower LL Vent/Cool (see FIG. 3e)
4'—ATM Robot Lower LL Pick
5'—ATM Robot FOUP Place As can be seen from the Table 1, once outgoing wafers are handed off to an atmospheric robot, for example, the loadlock can then be pumped down—it does not have to wait for the atmospheric robot to complete its moves before pumping down. This is distinguished from some types of bidirectional operation in which a loadlock is idle while the atmospheric robot places the processed wafers in a FOUP or other cassette and gets two unprocessed wafers from a cassette for placement into the loadlock. Various robot and loadlock moves according to certain embodiments are described below.
Incoming LL

TABLE 1

Robot and Loadlocks Moves in Unidirectional Flow Operation

| ATM Robot | Incoming LL (Upper) | Outgoing LL (Lower) | TM Robot |
| --- | --- | --- | --- |
| FOUP Pick (1) | Vent (Empty) | TM Robot | Lower LL Place (arm 2) |
| Upper LL Place (2) | ATM Robot (2) | Vent/Cool (Wafers) | PM Pick (arm 2) |
| Lower LL Pick | Pumpdown (Wafers) (3) | ATM Robot | PM Place (arm 1) |
| FOUP Place | TM Robot (4) | Pumpdown (Empty) | Upper LL Pick (arm 1) (4) |
| FOUP Pick | Vent (Empty) | TM Robot | Lower LL Place (arm 2) |
| Upper LL Place | ATM Robot | Vent/Cool (Wafers) | PM Pick (arm 2) (1') |
| Lower LL Pick | Pumpdown (Wafers) | ATM Robot | PM Place (arm 1) (5) |
| FOUP Place | TM Robot | Pumpdown (Empty) | Upper LL Pick (arm 1) |
| FOUP Pick | Vent (Empty) | TM Robot | Lower LL Place (arm 2) (2') |
| Upper LL Place | ATM Robot | Vent/Cool (Wafers) (3') | PM Pick (arm 2) |
| Lower LL Pick (4') | Pumpdown (Wafers) | ATM Robot (4') | PM Place (arm 1) |
| FOUP Place (5') | TM Robot | Pumpdown (Empty) | Upper LL Pick (arm 1) |

Table 1 presents an example of a sequence of unidirectional operational mode in which the transfer module robot hand-off sequence is process module (wafer exchange)→outgoing loadlock (place processed wafers)→incoming loadlock (pick unprocessed wafers). This is an example of one possible sequence—others may be used with the dual wafer handling apparatuses described herein, including outgoing loadlock accessed before the incoming loadlock.

Rows can be read as roughly simultaneously occurring or overlapping operations. Columns show the sequence of operations the robot or loadlock performs. Of course, in any system, these operations may not overlap exactly and one or more of the modules may be idle or begin or end later. Further, it should be noted that certain operations are not shown. The rotational and translational moves the robots must perform to reach the pods, loadlocks and process modules are not shown. The descriptions 'TM Robot' and 'ATM Robot' can refer to the moves the loadlocks undergo—opening and closing the appropriate doors—as well as admitting the robot end effectors to pick or place the wafers.

The path of a pair of unprocessed wafers going from a FOUP to a process module is traced in the Table in steps 1-5:
1—ATM Robot FOUP Pick
2—ATM Robot Upper Loadlock Place Pumpdown: Pressure in the upper loadlock is lowered from atmospheric to a predetermined subatmospheric pressure. This pumpdown operation is rapid.

Vent: Vent the upper loadlock from a subatmospheric pressure to atmospheric. No wafer is present. The upper loadlock may be vented radially as described below with reference to FIG. 6a. Like the pump down operation, the vent operation is fairly rapid.
Outgoing LL Vent/Cool: Vent the lower loadlock from a subatmospheric pressure to atmospheric pressure. Venting is done by flowing gases such as helium and/or nitrogen into the chamber. The wafers enter the lower loadlock needing to be cooled from processing. In one embodiment, helium is first vented into the chamber as a heat transfer gas, to an intermediate pressure. Gas flow is then stopped while the wafer cools. Nitrogen is then flowed to get the pressure up to atmospheric.

Pumpdown: Pump the lower loadlock from atmospheric to a pre-determined subatmospheric pressure. The chambers are empty.
ATM Robot FOUP Pick: The atmospheric robot picks two stacked unprocessed wafers from a FOUP or other cassette. In one embodiment, the end effectors are stacked on top of the other and pick the stacked wafers simultaneously. After picking the wafers, the end effectors are rotated with respect to each other, and the arm is rotated to place the wafers in the upper loadlock (see FIG. 3b, which shows a single arm dual end effector robot holding two wafers ready to place them into the upper loadlock). In certain embodiments, the wafers are picked consecutively in either order (e.g., where the ATM robot is a stacked dual end effector robot).

Upper LL Place: The atmospheric robot places the wafers into the upper loadlock chambers. In certain embodiments, first one end effector is extended into a chamber of the upper loadlock and lowers the wafer onto the shelf. The end effector is then retracted from the loadlock and the second end effector is extended into the other chamber of the upper loadlock and lowers the wafer onto the shelf.

Lower LL Pick: The atmospheric robot picks the wafers from the lower loadlock chambers. First one end effector is extended into a chamber of the upper loadlock and picks the wafer from the pedestal, which in certain embodiments may involve picking the wafer from a wafer lift mechanism that has lifted the wafer from the pedestal. The end effector is then retracted from the loadlock and the second end effector is extended into the other chamber of the lower loadlock and picks the wafer from the pedestal or lift mechanism. In certain embodiments, the robot uses information about the placement of each wafer in the lower loadlock to correct wafer position during the pick move. The atmospheric robot arm is then rotated to place the wafers in the FOUP.

FOUP Place: The atmospheric robot places the wafers into stacked positions in a FOUP. In one embodiment, both wafers are placed simultaneously.

Transfer Module Robot

Figure 3G:
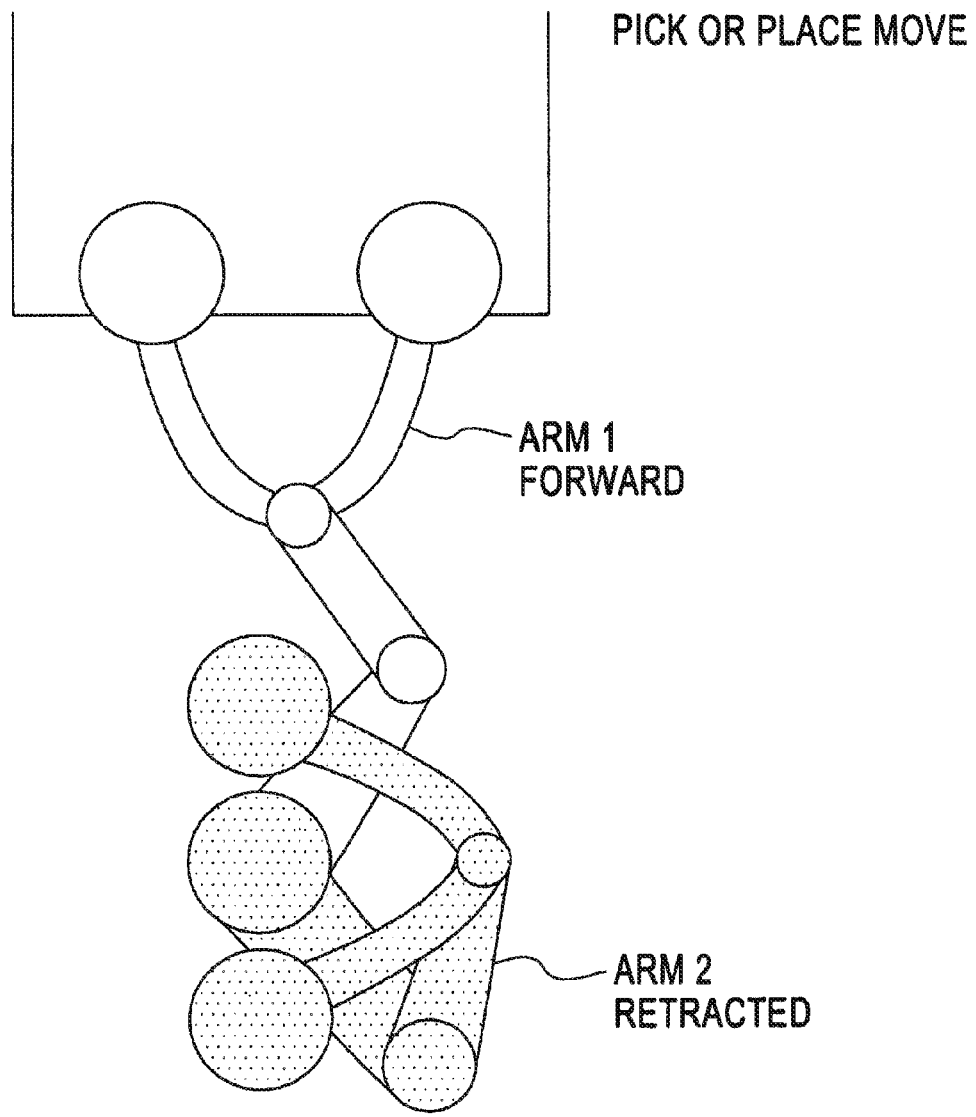
FIG. 3g shows a schematic of two arm dual end effector transfer module robot with one dual end effector arm in an extended position and the other dual end effector arm in a retracted position.

Upper LL Pick: The transfer module robot extends one dual end effector arm into the upper loadlock and lifts the wafers from the shelves onto the end effectors. In certain embodiments, as one arm is extended into the loadlock, the other arm moves into a retracted position. FIG. 3g shows a dual arm dual end effector robot with one arm extended (e.g., into a loadlock or process module for a pick or place move) and one arm retracted. In the scheme shown in Table 1, one arm is dedicated to taking unprocessed wafers from the upper loadlock and placing them in the process module (arm 1), and the other dedicated to taking processed wafers from the process module and placing them in the lower loadlock (arm 2). In other embodiments, both arms may be used for processed and unprocessed wafers. In the scheme shown in Table 1, after the upper loadlock pick move, the arm 1 retracts and arm 2 is extended into the lower loadlock to place processed wafers there.

Lower LL Place: The transfer module robot extends arm 2—having a processed wafer on each end effector—into the lower loadlock and places them there. In certain embodiments, this is done simultaneously. Position information of each wafer loadlock may be measured and stored for use by the atmospheric robot in picking the wafers. The robot is then positioned for the process module pick move. In certain schemes, the wafers' positions may be independently corrected prior to placement by using the wafer lifts independently.

Process Module Pick: The transfer module robot extends arm 2 into the process module and picks the two processed wafers. In certain embodiments, this is done simultaneously. In the scheme shown in Table 1, after the process module pick, the transfer module robot places the unprocessed wafers into the process module.

Process Module Place: The transfer module robot extends arm 1—having two unprocessed wafers—into the process module and places them at the stations (as in FIG. 4) either by lower the wafers onto the stations, or by wafer supports in the stations lifting the wafers off the end effectors. In certain embodiments, the place moves are done sequentially to allow position corrections to be made in each place move.

FIGS. 1-3 and the associated discussion provide a broad overview of the dual wafer processing apparatus and methods discussed herein. Details of the transfer methods according to various embodiments have been omitted and are discussed in further detail below, including wafer pick and place moves, wafer alignment, pressurization and depressurization cycles, etc. Additional details of the apparatus according to various embodiments are also discussed below.

Figure 4A:
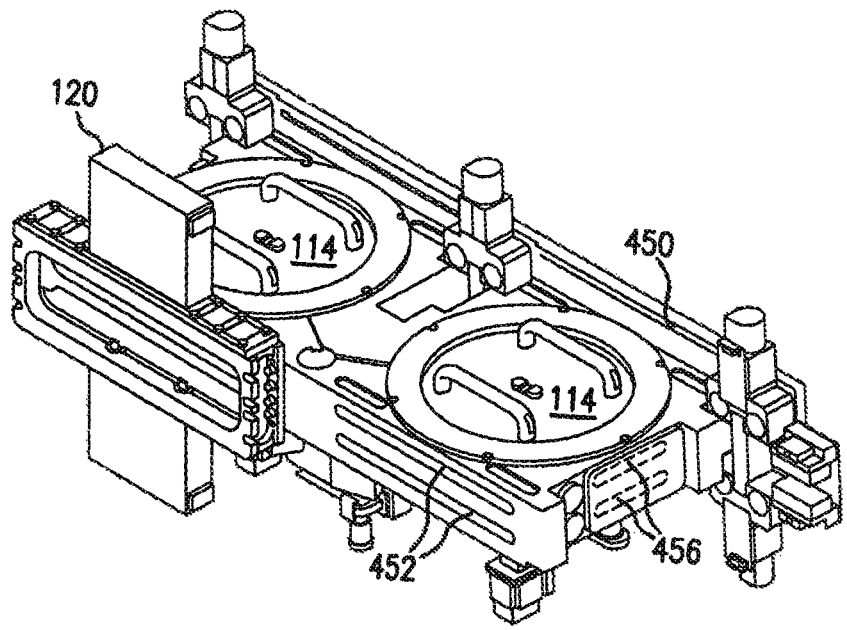
FIGS. 4a and 4b are schematics of a stacked loadlock according to certain embodiments.
Figure 4B:
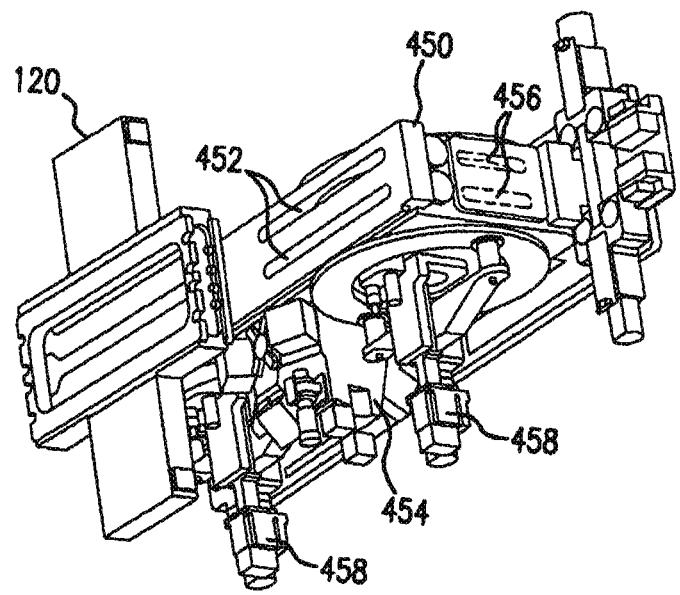

FIGS. 4*a* and 4*b* show an example of a loadlock assembly having stacked independent loadlocks. In FIGS. 4*a* and 4*b*, the transfer module side of the loadlock assembly faces front. As described above, each loadlock has two connected chambers. Lids 114 each cover one chamber of the upper loadlock. Slit valves 120 show valves allowing access from the loadlock to the transfer module on the left side of the loadlocks. The valves on the right side are not shown in the figure to provide a view of the housing 450 and the loadlock assembly openings 452 in the housing 450. In certain embodiments, the slit valves may be independently controlled but tied together pneumatically. Isolation manifold 454 leads to the loadlock pump is used for equilibration and pumpdown operations. Side ports 456 allow viewing of the interior of the loadlock. Lower loadlock lift mechanism 458 is used to raise and lower the wafers from the cool plate to allow robot end effectors the clearance to pick and place wafers. This allows for a cool plate without large clearances cut for the end effectors. As described further below, in certain embodiments, the loadlock chambers are tolerant of a range of wafer positions, e.g., a transfer module robot may place the wafers in the loadlock without any position correction. The loadlock may be configured to tolerate the offset wafer position without any centering. Position correction may then be made during the pick from the loadlock by the atmospheric robot.

Wafer Position Correction

FIGS. 3*a*-3*f* and accompanying description above describe various wafer handling tasks, including pick and place moves. In performing the various wafer handling tasks described herein, the wafer transfer robots use programmed coordinate information of the loadlocks, process modules, FOUPs, etc. Using this information and its present position, a robot can move along a nominal or standard path to move a wafer from one location to another. At certain points, the position of a wafer may need to be adjusted to correct for wafer shifting during robot hand-off, robot movement or in a loadlock, process module or cassette. Wafer position correction may be accomplished in a variety of manners—for example, U.S. Pat. No. 6,405,101, hereby incorporated by reference, describes a wafer centering system in which sensors are used to detect the edges of the wafer as the wafer is passed over the sensors. This edge detection information is then used to modify the place move to compensate for any deviation of the wafer from a reference position. Some systems use mechanical centering methods—for example, self-centering methods in which a wafer is guided into position after hand-off by a sloped surface or pads at the loadlock, process module or other destination station. Other systems rely on a dual-edge gripper in which a wafer is picked up and then gripped—thereby forcing the wafer into a set position.

According to various embodiments, methods of correcting wafer position at certain points using a dual wafer transport apparatus are described. In certain embodiments, the methods involve correcting positions at placement at a location (e.g., in a process module). In certain embodiments, the methods are used with loadlocks that tolerate off-center wafers, and make corrections at placement into the process module and wafer cassette stations.

In certain embodiments, methods of performing place moves using dual side-by-side end effector robots with active wafer position correction are described. These methods may be used for placement into a process module, loadlock or other destination by a dual wafer transfer module robot. As indicated above, in certain embodiments, the loadlocks (incoming or outgoing loadlock) is tolerant of off-center wafers and placement of the wafers into the outgoing loadlock is performed without correction.

As described above, in certain embodiments, the transfer module robot has dual side-by-side end effectors on each arm. The robot can provide nearly double the throughput of a single wafer transfer robot by transferring two wafers with the same number of moves. The end effectors are fixed relative to each other and therefore move in unison. A dual end effector robot holding two wafers, one on each end effector, extends the end effectors along a nominal path. The nominal path is a preprogrammed standard path for moving from a first location, e.g., a loadlock, to a second location, e.g., a process module. The nominal path typically includes a rotational motion and then a radial or extension motion into the placement position. The hand-off is then accomplished by the robot lowering the wafers onto wafer supports or by lift pins at the destination stations lifting each wafer off its end effector.

Figure 5A:
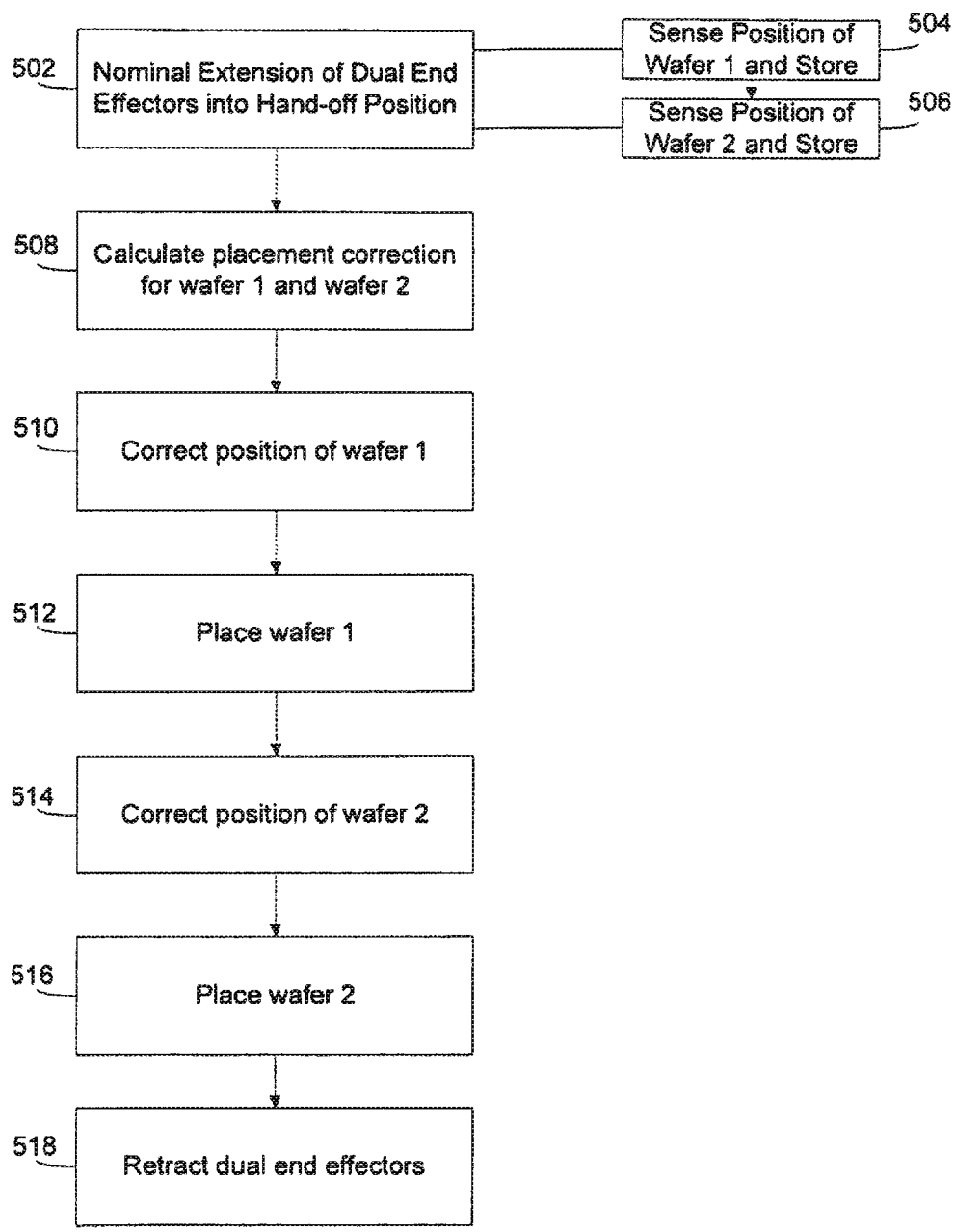
FIG. 5a is a process flow sheet illustrating operations in a method of transferring wafers using a dual side-by-side wafer transfer robot.

FIG. 5a is a flowchart showing operations in a method of active wafer center position correction wafer position using a dual side-by-side end effector robot. The method begins at block 502 in which the wafers on the dual end effectors are extended along the nominal path into the process module or other location. The robot has input and output lines for reading sensors and sending position information to a processor. As the robot is extended along the nominal path, sensors measure the position of both wafers. The information is collected. This is indicated at blocks 504 and 506. In the process shown in FIG. 5a, the data collection of wafer 2's position is offset from that of wafer 1, e.g., by 10 mm. This is to avoid overwhelming the sensing and data collection hardware and software. However, in certain embodiments, the positions may be measured simultaneously. Also, position measurement is not limited to the extension move—for example, wafer positions can be measured during the retraction path from the loadlock during the pick move, or at another point along the nominal path.

The position information may include wafer edge detection information. See, e.g., above-referenced U.S. Pat. No. 6,405,101. After the wafer positions are sensed, the processor receives this information and then calculates the placement correction necessary for both wafers. Block 508. Small rotational and extension (radial) corrections are made as necessary to center wafer 1 correctly over the pedestal or other wafer support. Block 510. Wafer 1 is then placed at its station, while wafer 2 remains on its paddle or other end effector. Block 512. In certain embodiments, placing the wafer at its station involves the station lift pins lifting the wafer from the end effector. Small rotational and extension (radial) corrections are then made as necessary to center wafer 2 at its station. Wafer 2 is then placed at its station. Block 516. The robot arm is retracted with the wafers staying at the destination. Block 518. Placement of the wafers may be accomplished by lowering each wafer to a fixed support, or by using independently controlled lift devices. If the former is used, the fixed supports are at different heights such that wafer 2 remains on the end effector when the end effectors are lowered to place wafer 1. If independently controlled lift pins are used, the lift pins or other lift device raises to lift the applicable wafer off its end effectors. The lift devices may lower the wafers after the end effectors have been retracted.

Figure 5B:
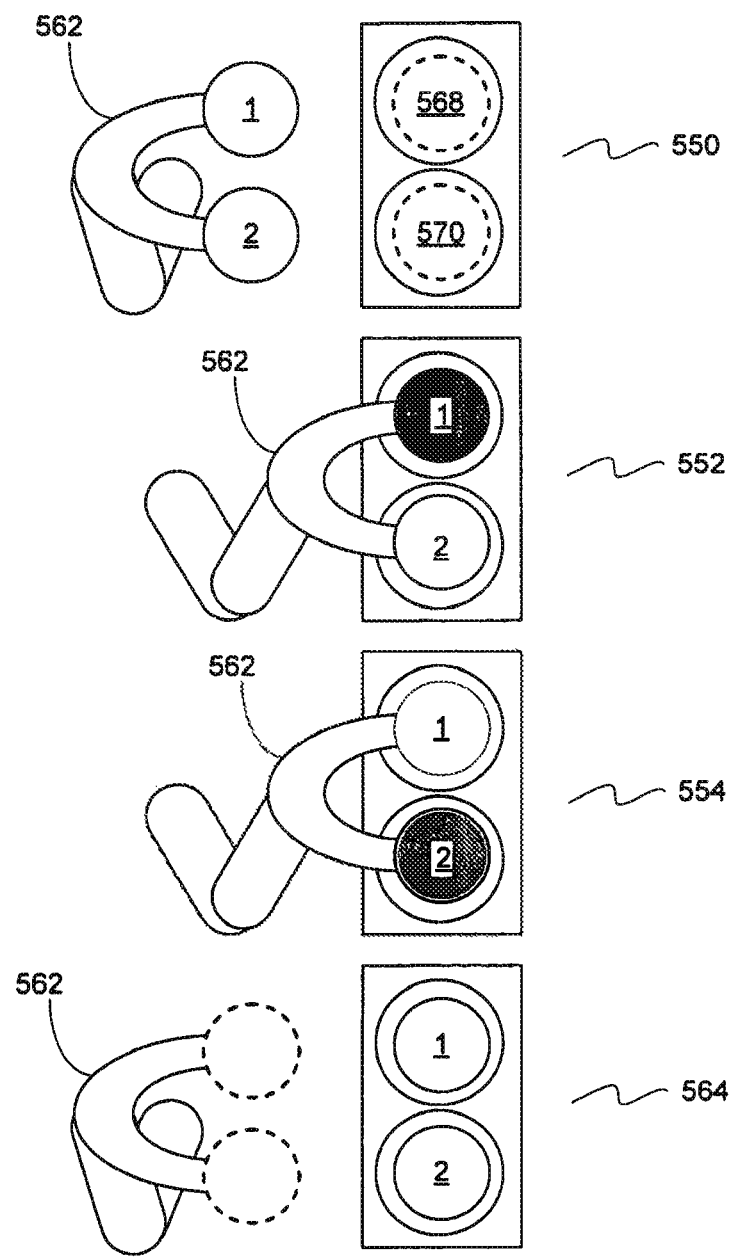
FIG. 5b shows graphical representations of top views of a dual side-by-side wafer transfer robot and a process module having side-by-side processing stations at certain wafer transfer operations.

FIG. 5b shows illustrations of certain operations discussed in reference to FIG. 5a. FIG. 5b shows the dual end effectors on the robot arm 562 holding wafers 1 and 2. At 550, the robot arm is in a retract position. Hand-off locations (e.g., process module stations) are indicated at 568 and 570. The dotted circles indicate an unoccupied wafer location. Next, at 552, the robot arm 562 is extended into the process module and has been extended or rotated as necessary to place wafer 1 (in grey) in the correct hand-off position. At 554, lift pins (not shown) have lifted wafer 1 from its end effector and the robot has been further extended and rotated to place wafer 2 is in its correct hand-off position. At 556, the robot arm 562 is retracted. The wafers stay at their respective stations.

Figure 6:
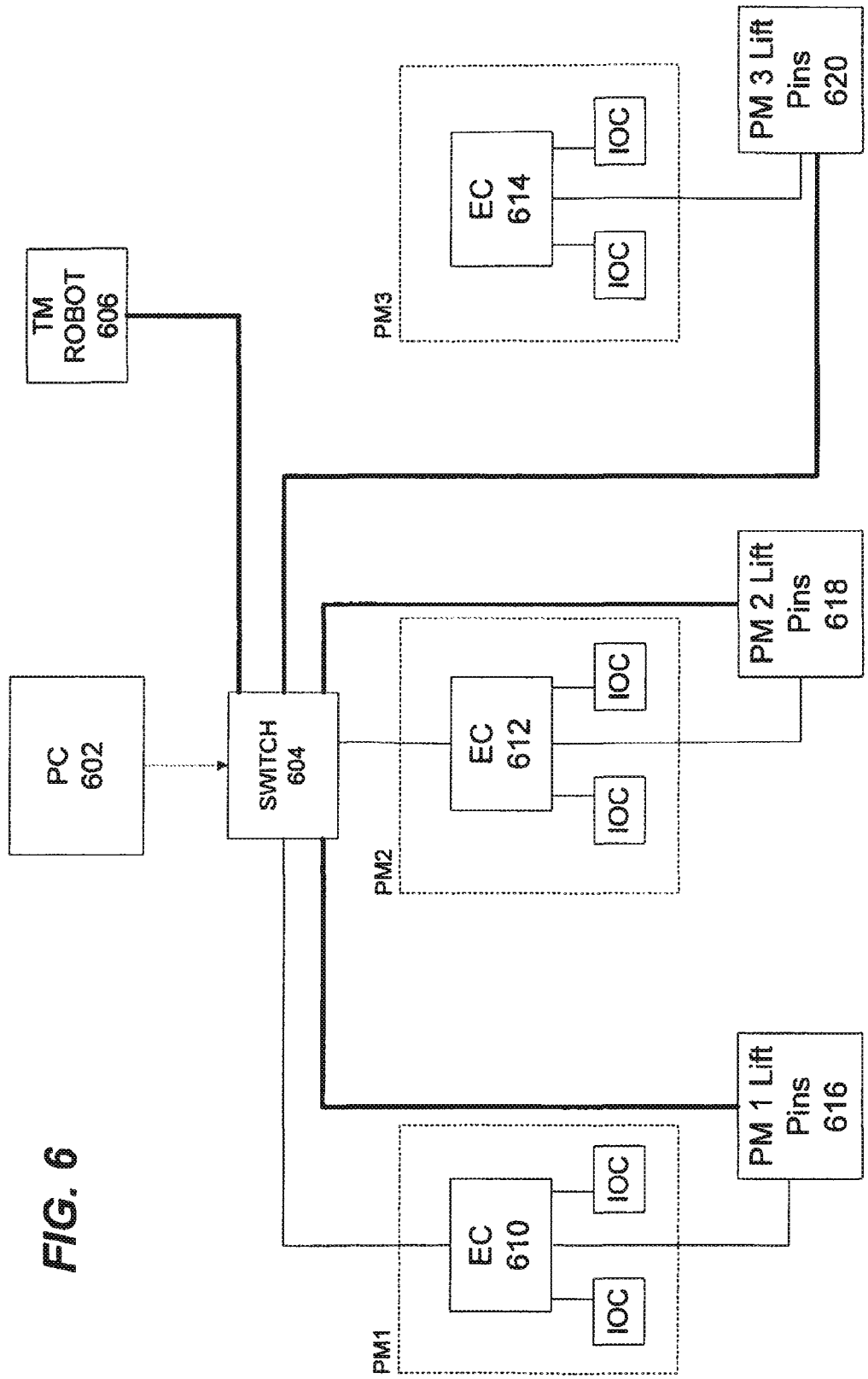
FIG. 6 is a block diagram showing certain components of a control system used in certain embodiments.

In certain embodiments, the robot communicates with the lift pins at each destination wafer station to lift and lower the pins. FIG. 6 shows a block diagram illustrating control of the lift pins according to certain embodiments. Platform controller (PC) 602 is the main controller for the entire tool including the wafer handling apparatus and the process modules to which it is coupled. Platform controller 602 acts as the system controller, which controls scheduling, tells the process module controllers what process to perform on a wafer, etc., as well as a module controller for the wafer handling apparatus.

Platform controller 602 sends commands to process module controllers (ECs) 610, 612 and 614 and the transfer module robot 606 via switch 604. (Other parts of the tool that the process controller may control are not shown in this figure). Each EC controls a process module: EC 610 controls process module 1 (PM1), EC 612 controls PM2 and EC 614 controls PM3. There are typically multiple input/output controllers (IOCs) in each module as indicated in FIG. 6 for connecting to the individual valves, sensors, etc. in each module. The controllers can be physically located at various points in the apparatus; e.g., within the process module or on a stand-alone rack standing at some distance away from the module.

The lift pins for each process module are indicated at 616 (PM1), 618 (PM2) and 620 (PM3). Each process module typically has a set of lift pins for each station within the module. Each set may be independently controlled. TM Robot 606 can control the lift pins as indicated by the bold connection lines in the figure. The lift pins thus have two masters—the process module and the transfer module robot. In certain embodiments, a dual end effector transfer module robot controls the lift pins during place moves to perform staggered independent wafer corrections as described above.

The above described methods may be used when placing wafers at a location (e.g., a process or other module) using a dual side-by-side end effector robot, such as that shown in FIG. 5b. Wafer position error is measured prior to the place, and then the place moves are performed independently.

Figure 7A:
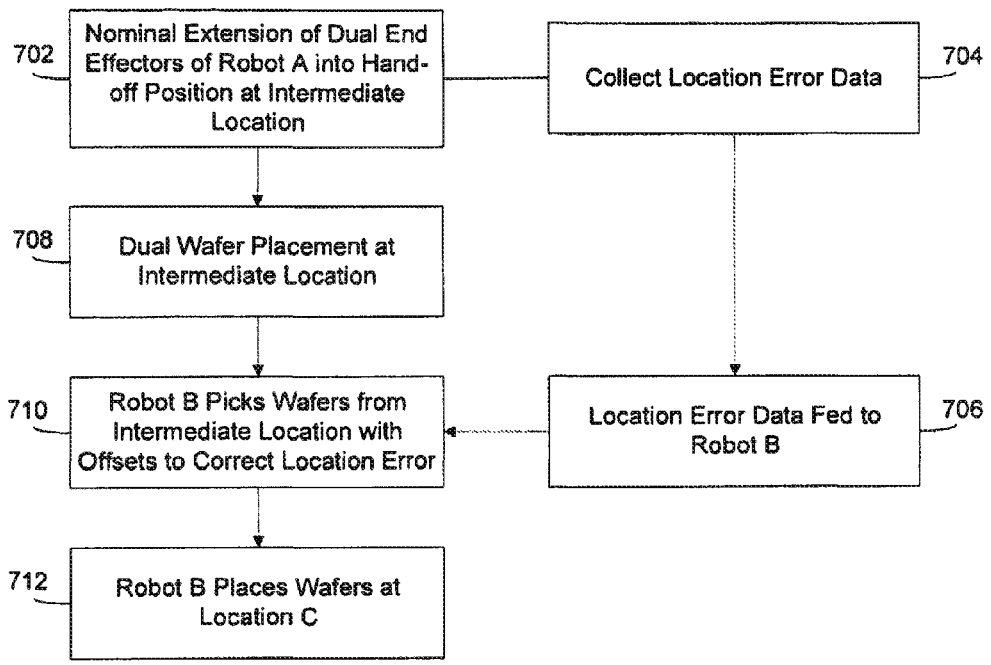
FIG. 7a is process flow sheet illustrating operations in a method of transferring wafers from a first location to a second location using two wafer transfer robots.

Another method of correcting wafer position error involves measuring wafer position error on a robot, e.g. a dual side-by-side end effector robot, during transfer to an intermediate station. This measurement data is then used by a second robot to perform wafer pick moves from the intermediate station with corrections to center the wafer. FIG. 7a is a flowchart showing operations in a method of wafer position correction using two robots and an intermediate transfer station. First, a robot (Robot A) having dual end effectors each holding a wafer extends the end effectors into nominal hand-off positions at the intermediate location. Block 702. In certain embodiments, the Robot A has dual side-by-side end effectors fixed relative to one another, though the methods described are not limited to such a robot. During the extension process, the location of each wafer on the effector is measured. Block 704. In other embodiments, the location data may be read at other points—for example, during a retraction from a previous location (e.g., a process module) or during transfer from a previous location to the intermediate location. After the end effectors have been extended to the nominal hand-off position, the wafers are placed at the intermediate location. Block 708. Note that the wafer positions are as yet uncorrected—thus, the intermediate location should be tolerant of offset wafers. Returning to the right side of the flowchart, after the location data is measured, location error data is fed to Robot B. The error data may include the positions of the wafers on the end effectors and/or calculated corrections (based on position information) to the pick moves Robot B will make. Using the error data and/or calculated corrections, Robot B picks the wafers from the intermediate location with offsets to correct location error. Block 710. Unlike the place moves to the intermediate location (block 708), which may be simultaneous, the wafers are picked consecutively so that the necessary rotational and extension adjustments to pick up each wafer may be performed. (If Robot B is capable of performing these adjustments and pick moves simultaneously, the pick moves may be simultaneous.) Because Robot B received location error information from Robot A, and picked the wafers to adjust for the error, the wafer positions on the end effectors are correct. Robot B then transfers the wafers to a location C, and places them there. Block 712. Because the wafer positions on the end effectors of Robot B are correct, the wafers are placed without the need for additional corrections and may be placed simultaneously. In many embodiments, the adjustments made by Robot A are made based solely on the measurements made in operation 704; however in certain embodiments the adjustments made by Robot B may also take into account other measurements or standard adjustment factors, e.g., to account for any shifting that takes place within the intermediate location.

Figure 7B:
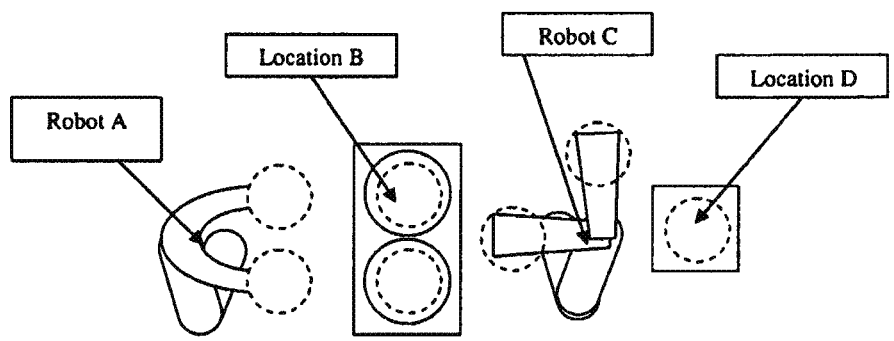
FIG. 7b shows a graphical representation of a certain components dual robot wafer transfer system according to certain embodiments.

FIG. 7b illustrates a dual robot system in which the above-described method may be used. Here, Robot A is a dual side-by-side end effector robot, wherein the end effectors are fixed relative to each other. It is capable of simultaneous pick and place moves of two wafers in side-by-side locations. In certain embodiments, this robot is a transfer module robot used to transfer wafers between a loadlock and one or more process modules. In certain embodiments, the robot has more than one arm, each arm having dual end effectors such as described above in FIG. 3g. The intermediate station in FIG. 7b is a loadlock having side-by-side chambers to hold each of the wafers. One such loadlock is depicted above in FIGS. 4a and b. Robot B in the example of FIG. 7b is a stacked dual end effector robot. In certain embodiments, this robot is an atmospheric robot that transfers wafers between the loadlock and a stacked wafer location, e.g., a FOUP or cassette. The wafer flow schemes described above in reference to FIGS. 3a-3f may be used with this arrangement.

The system shown in FIG. 7b is one example of possible arrangements of dual robots in which a first robot places one or more wafers in an intermediate location with position error measurement but not correction, and a second robot picks the one or more wafers with correction based on that measurement. With dual end effector robots, each of the robots may have side-to-side end effectors or stacked end effectors.

The methods and systems described above allow wafer corrections to be made at only one location—if Robot A is a wafer throughput limiter, this system improves the throughput by avoiding performing the corrections at the Robot A hand-off to intermediate station B. Further, correcting wafer position at the intermediate station would require some mechanism within the place location (e.g., a pin lift) to allow for consecutive single wafer transfers (e.g., extend arm to intermediate station with correction. The methods described above also allow Robot B to perform a simultaneous place move to location D with the wafers accurately positioned. These advantages are not limited to the system described above, but apply to other systems in which Robot A is a throughput limiter and/or position correction mechanisms at the intermediate station are undesired.

As indicated above, the intermediate station should be tolerant of a range of wafer positions. In certain embodiments, this means that the wafer rests substantially where placed by the Robot A—without sliding or self-centering on a sloped surface or pads. The shape and position of the load lock walls are such that a grossly misplaced wafer (e.g., >6 mm) will still clear. For example, if it is possible for the transfer module robot to have one wafer placed 6 mm one direction, and the other wafer 6 mm the other direction, the load lock has 12 mm of clearance in all directions. If wafer position is corrected sequentially in this scenario, the wafer being corrected second must have a full 12 mm of clearance. The wafer cooling plates and handoff pins are also designed to be tolerant of misplaced wafers. Wafer gap to the cooling plate is critical to proper wafer cooling. The rest pins for the wafer are designed with a down slope, e.g., of one degree. The down slope is enough of an angle to prevent backside contact of a highly dished wafer and is shallow enough so that if a wafer is misplaced by up to 6 mm, the change in gap along that slope is negligible.

In certain embodiments, a controller is employed to control aspects of the wafer transfer and position error correction processes described above. The controller will typically include one or more memory devices and one or more processors. The processor may include a CPU or computer, analog and/or digital input/output connections, stepper motor controller boards, etc. The controller executes system control software including sets of instructions for controlling the timing, Other computer programs stored on memory devices associated with the controller may be employed in some embodiments. In certain embodiments, there will be a user interface associated with the controller. The user interface may include a display screen, graphical software displays of the apparatus and/or process conditions, and user input devices such as pointing devices, keyboards, touch screens, microphones, etc.

The computer program code for controlling the transfer and position error correction and other processes in a process sequence can be written in any conventional computer readable programming language: for example, assembly language, C, C++, Pascal, Fortran or others. Compiled object code or script is executed by the processor to perform the tasks identified in the program. Parameters may be provided to the user in the form of a recipe, and may be entered utilizing the user interface. Examples of parameters that may be provided to or entered by the user include the time delay for wafer cooling, time delay between a switch closing and a valve opening, the trigger point for a pressure control system to close a valve, a pressure setpoint for a throttle valve, and a flow setpoint for a mass flow controller. Signals for monitoring the process may be provided by analog and/or digital input connections of the system controller. The signals for controlling the process are output on the analog and digital output connections of the apparatus. The system software may be designed or configured in many different ways. For example, various transfer apparatus component subroutines or control objects may be written to control operation of the apparatus components necessary to carry out the inventive transfer processes. Examples of programs or sections of programs for this purpose include robot positioning code, wafer positioning code, wafer position detection code, position information transfer code. A system controller may also include code to run pumpdown/vent or process module operations. A robot positioning program may include program code for moving the robot along a path, e.g., a nominal (standard) path or along a path as dictated by position correction calculations. A wafer positioning program may include program code for controlling robot and chamber components, such as lift pins, that are used to place or pick the wafer to or from a pedestal, chuck or support and to control the spacing between the substrate. A wafer position detection program may include code for measuring the position of a wafer on an end effector. A wafer correction program may include code for determining rotation and extension/retraction adjustments a robot should make based on measured position information. A position information transfer program may include code for storing, sending and/or receiving position detection information to a second robot.

In certain embodiments, a series of programs may be associated with any or each of the following modules: the mini-environment, inbound load lock, outbound load lock, transfer module and each process module, with a each of these capable of running a single program at a time. For example, an inbound load lock may have a vent program and a pumpdown program.

A higher level scheduler program may include code for receiving or obtaining information about wafers and process recipes and code for instructing certain modules to run the appropriate programs. For example, code may include instructions for the transfer module robot exchange wafers program can exchange wafers with a process module, while the atmospheric robot is picking wafers from a FOUP. Scheduler rules and logic generally prevent two robots from trying to access the same load lock at the same time, unless the action is intentional. The scheduler program code includes checks to ensure process operations occur in the proper sequence, e.g., that a vent on a load lock is executed before executing an ATM place wafer program to that load lock.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

The invention claimed is:

1. A method comprising:
   obtaining, by one or more processors, position information of a first substrate relative to an end effector of a first robot;
   placing the first substrate at an intermediate location with the first robot; and
   picking the first substrate from the intermediate location with an end effector of a second robot, wherein the position of the end effector of the second robot is adjusted based on the position information.

2. The method of claim 1, wherein the position information is obtained during an extension move of the end effector of the first robot to a hand-off position at the intermediate location.

3. The method of claim 1, wherein the position information is obtained during a retraction move of the end effector of the first robot from a first location.

4. The method of claim 1, wherein the position information is obtained during transfer of the end effector along a nominal path between a first location and the intermediate location.

5. The method of claim 1, further comprising obtaining position information about a second substrate relative to a second end effector of the first robot and placing the second substrate at the intermediate location with the first robot.

6. The method of claim 5, wherein the first substrate and the second substrate are placed at the intermediate location simultaneously.

7. The method of claim 5, further comprising picking the second substrate from the intermediate location with a second effector of the second robot, wherein the position of the end effector of the second robot is adjusted based on the position information.

8. A method comprising measuring wafer position information of one or more wafers handled by a first robot during transfer from the first location to an intermediate location and determining, by one or more processors, a trajectory of one or more end effectors of a second robot based on the measured position information.

9. An apparatus, comprising:
   a first robot having an end effector configured to carry a substrate;
   a substrate storage location;
   a second robot having an end effector configured to carry a substrate; and
   a controller that controls measuring position information of the substrate relative to the end effector of the first robot, placing a substrate carried by end effector of the first robot at the substrate storage location, calculating position adjustment to the end effector of the second robot based on the measured position information, and picking the substrate from the substrate storage location wherein the position of the end effector of the second robot using the calculated position adjustments.

10. The apparatus of claim 9, wherein the substrate storage location is a loadlock.

11. The apparatus of claim 9, wherein the substrate storage location has a substrate placement tolerance greater than 6 mm.

12. The apparatus of claim 9, wherein the substrate storage location comprises sloped rest pins.

13. An apparatus comprising:
   sensors configured to measure a position of a substrate with respect to a first robot; and
   a controller comprising computer readable media, the computer readable media comprising:
   code for measuring position of the substrate with respect to the first robot; and
   code for determining an adjustment to a trajectory of a second robot based on the measured substrate position.

14. The apparatus of claim 13, wherein the code for determining an adjustment comprises code for centering the substrate with respect to the end effector of the second robot.

15. The apparatus of claim 13, wherein the code for measuring a position of the substrate with respect to the first robot includes code for measuring the position during an extension move of an arm of the first robot.

16. The apparatus of claim 13, wherein the code for measuring a position of the substrate with respect to the first robot includes code for measuring the position during a retraction move of an arm of the first robot.

\* \* \* \* \*